(12) United States Patent
Ishihara et al.

(10) Patent No.: US 6,798,059 B1
(45) Date of Patent: Sep. 28, 2004

(54) MULTILAYER ELECTRONIC PART, ITS MANUFACTURING METHOD, TWO-DIMENSIONALLY ARRAYED ELEMENT PACKAGING STRUCTURE, AND ITS MANUFACTURING METHOD

(75) Inventors: Shosaku Ishihara, Yokohama (JP); Masato Nakamura, Yokohama (JP); Takashi Kuroki, Yokohama (JP); Shuzou Sano, Tokyo (JP); Mikio Izumi, Tokyo (JP); Takaya Osawa, Tokyo (JP); Mitsuhiro Oshiki, Tokyo (JP)

(73) Assignees: Hitachi, Ltd., Tokyo (JP); Hitachi Medical Corporation Co., Ltd., Tokyo (JP)

( * ) Notice: Subject to any disclaimer, the term of this patent is extended or adjusted under 35 U.S.C. 154(b) by 0 days.

(21) Appl. No.: 09/830,127
(22) PCT Filed: Oct. 22, 1999
(86) PCT No.: PCT/JP99/05848
§ 371 (c)(1),
(2), (4) Date: Apr. 24, 2001
(87) PCT Pub. No.: WO00/26971
PCT Pub. Date: May 11, 2000

(30) Foreign Application Priority Data

Oct. 29, 1998 (JP) ............................................. 10-308726

(51) Int. Cl.[7] ............................................. H01L 23/053
(52) U.S. Cl. .................... 257/700; 257/701; 438/125
(58) Field of Search ................................. 257/678, 690, 257/750, 414, 416, 700, 701; 438/125, 162

(56) References Cited

U.S. PATENT DOCUMENTS 5,381,385 A * 1/1995 Greenstein .................. 267/140

* cited by examiner

*Primary Examiner*—Roy Potter
(74) *Attorney, Agent, or Firm*—Antonelli, Terry, Stout & Kraus, LLP (57) ABSTRACT

In order to provide a two-dimensionally arrayed probe (element packaging structure) in which a multilayer element can be used as a piezoelectric ceramic transducer element, each defective element can be replaced and the ill connection of each element can be repaired, and in order to provide a multilayer electric part suitable for realizing such an element packaging structure, the multilayer electronic part is configured with a multilayer chip-like element having a surface electrode, an internal electrode and a back electrode on the one hand and a flexible board attached to one side surface of the chip-like element on the other hand, alternate ones of the electrodes along the multilayer of the chip-like element are connected electrically to each other by the electrode pattern of the flexible board thereby to form two electrode groups, and the end portions of the electrode pattern of the flexible board are used as the two electrode portions for external connection which are electrically connected to the two electrode groups.

22 Claims, 10 Drawing Sheets

MULTILAYER ELECTRONIC PART, ITS MANUFACTURING METHOD, TWO-DIMENSIONALLY ARRAYED ELEMENT PACKAGING STRUCTURE, AND ITS MANUFACTURING METHOD

TECHNICAL FIELD

The present invention relates to a multilayer electronic part, its manufacturing method, a two-dimensionally arrayed element packaging structure and its manufacturing method, or in particular a technique for a probe having a multiplicity of two-dimensionally arrayed piezoelectric ceramic transducer elements (multilayer electronic part) suitably used, for example, to attain a high performance of an ultrasonic probe apparatus.

BACKGROUND ART

In recent years, an ultrasonic transceiver using a piezoelectric ceramic transducer element has come to be used for various applications. Especially, the ultrasonic diagnostic system which, unlike the X-ray diagnosis, permits the interior of the human body to be observed without adversely affecting the human body has extended widely as medical equipment. The ultrasonic diagnostic system used for the ultrasonic diagnosis method uses a probe having a multiplicity of piezoelectric ceramic transducer elements as an ultrasonic transceiver. The probe configured with piezoelectric ceramic transducer elements includes a scanning probe having a multiplicity of minuscule piezoelectric ceramic transducer elements arranged for diagnosing the interior of the human body by forming tomographic images.

Among these probe structures, with the probe having one-dimensionally arranged piezoelectric ceramic transducer elements, the focal point can be arbitrarily set at a near or far point from the probe by selecting the number of elements arranged in a given direction, while the focal point is fixed in the direction orthogonal to the particular direction, and therefore a clear image cannot be produced in other than the range corresponding to the depth of focus.

In order to solve the disadvantage described above, a two-dimensionally arrayed probe structure having piezoelectric ceramic transducer elements arranged not only in a single direction but also in the direction orthogonal thereto has been developed. Such a probe structure is described, for example, in "1996, IEEE Ultrasonics Symposium, pp. 1523–1526". With this two-dimensional probe structure, a key to achieving a high performance is how the piezoelectric ceramic transducer elements are reduced in size and how densely they are arranged in a limited space. Along with the high-density arrangement, it is important that each of the two-dimensionally arrayed piezoelectric ceramic transducer elements and the electrical connections thereof are free of a defect, i.e. each piezoelectric ceramic transducer element making up the probe is free of a defect.

From this viewpoint, a method of configuring two-dimensionally arranged probe structure configured of modules each having a plurality of elements is described in "1996 IEEE Ultrasonics Symposium, pp. 1573–1576". This publicly known reference discloses a method of constructing a probe structure having 4096 (64×64) elements of 0.22 mm×0.22 mm as a combination of a plurality of modules each including two columns of 64 elements.

The conventional modular structure disclosed in the aforementioned reference, however, is so configured that a flexible wiring board and a common electrode are connected to the surface of each piezoelectric ceramic transducer element to drive the particular piezoelectric ceramic transducer element. Thus, the elements are not structured independently of each other but bonded to each other. A defective or ill-connected element, if included in the elements that have built up a module, therefore, cannot be independently replaced or the connection failure thereof cannot be repaired easily, thereby leading to the problem of a low yield for each module.

Also, the conventional modular structure presupposes that each piezoelectric ceramic transducer element is configured of a single board (single layer), and no consideration is given of the application to a multilayer piezoelectric ceramic transducer element required for improving the probe performance.

Figure 15:
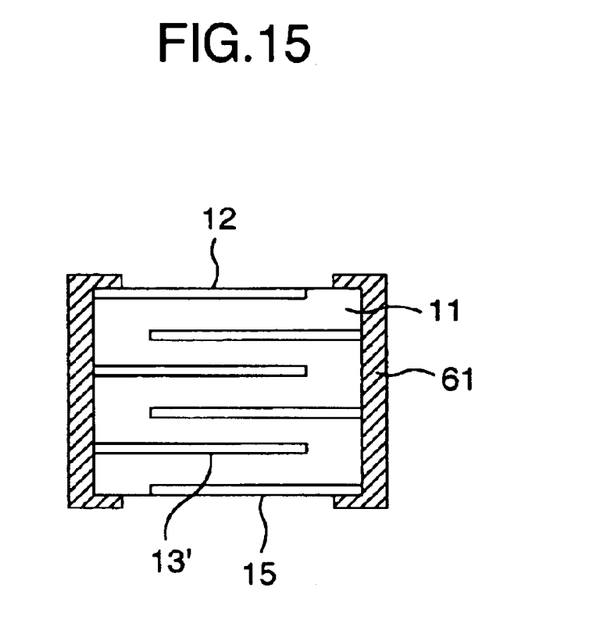
FIG. 15 is a diagram for explaining an example of a conventional multilayer electronic part (piezoelectric ceramic transducer element).
Figure 16:
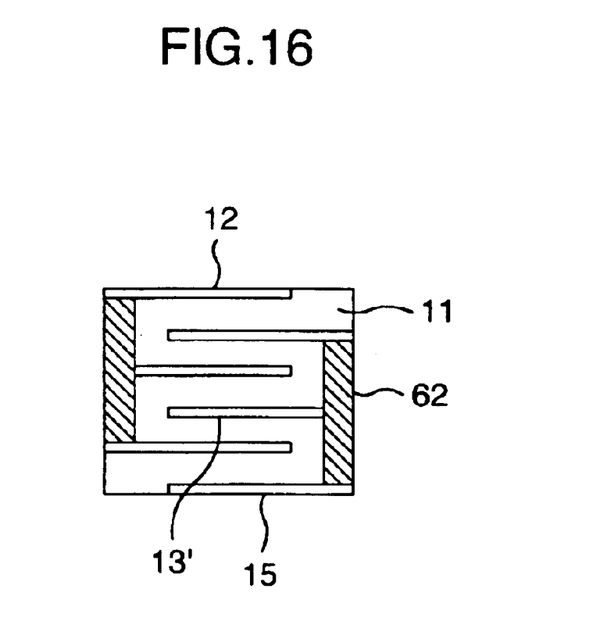
FIG. 16 is a diagram for explaining another example of a conventional multilayer electronic part (piezoelectric ceramic transducer element).

Further, the conventional multilayer piezoelectric ceramic transducer element configured either in such a manner that as shown in FIG. 15, alternate ones of a surface electrode 12, an internal electrode 13' in ceramics 11 and a back electrode 15 along the thickness of the multilayer are electrically connected to each other by side electrodes 61 formed on the two opposed side surfaces of the element, or in such a manner that as shown in FIG. 16, alternate ones of the surface electrode 12, the internal electrode 13' and the back electrode 15 are electrically connected to each other alternately along the thickness of the multilayer by a conductive material 62 filled in a through hole. As a result, the production process is comparatively complicated and the size reduction is limited. Also, for connecting the two electrode groups of the element to an external means, the two surfaces of the element are unavoidably used for external connection. Thus, it is difficult to replace the element or repair the connection, thereby making the application to the probe unsuitable.

The present invention has been developed in view of this point, and the object thereof is to provide a two-dimensionally arrayed probe (element packaging structure) in which a multilayer element can be used as a piezoelectric ceramic transducer element and each defective element, if any, can replaced or any ill connection of each element can be repaired on the one hand, and to provide a piezoelectric ceramic transducer element (multilayer electronic part) suitable for realizing such an element packaging structure on the other hand.

DISCLOSURE OF INVENTION

In order to achieve the object described above, according to this invention, a multilayer electronic part is configured with, for example, a multilayer chip-like element having a surface electrode, an internal electrode and a back electrode and a flexible board attached to one side surface of the chip-like element, alternate ones of the electrodes along the thickness of the multilayer of the chip-like element are connected electrically to each other by electrode patterns of the flexible board thereby to form two electrode groups, and the end portions of the electrode patterns of the flexible board, for example, are used as two electrode portions for external connection which are electrically connected with the two electrode groups. A plurality of the aforementioned multilayer electronic parts are arranged in columns and rows and integrated into a two-dimensionally arrayed module. As many modules as required are combined to construct a probe for an ultrasonic probe apparatus.

The use of the multilayer piezoelectric ceramic transducer element (the multilayer electronic part described above) makes it possible to produce a compact, high-performance probe. Also, in view of the configuration in which each multilayer electronic part (piezoelectric ceramic transducer element) is provided with two independent electrode portions for external connection, each multilayer electronic part (piezoelectric ceramic transducer element) can be inspected for a defective chip-like element and a connection failure. Thus a defective multilayer electronic part can be replaced and the ill connection of each multilayer electronic part can be repaired easily for each piezoelectric ceramic transducer element (multilayer electronic part). As a result, the defective module is eliminated and a high-yield module production is made possible. Further, the connection for forming two electrode groups of a chip-like element and the formation of electrode portions for external connection are performed by the electrode patterns of the flexible board on one side surface of the chip-like element. Therefore, the production process is simplified and the multilayer electronic part (piezoelectric ceramic transducer element) can be remarkably reduced in size.

BEST MODE FOR CARRYING OUT THE INVENTION

Embodiments of the invention will be explained below with reference to the drawings.

Figure 1:
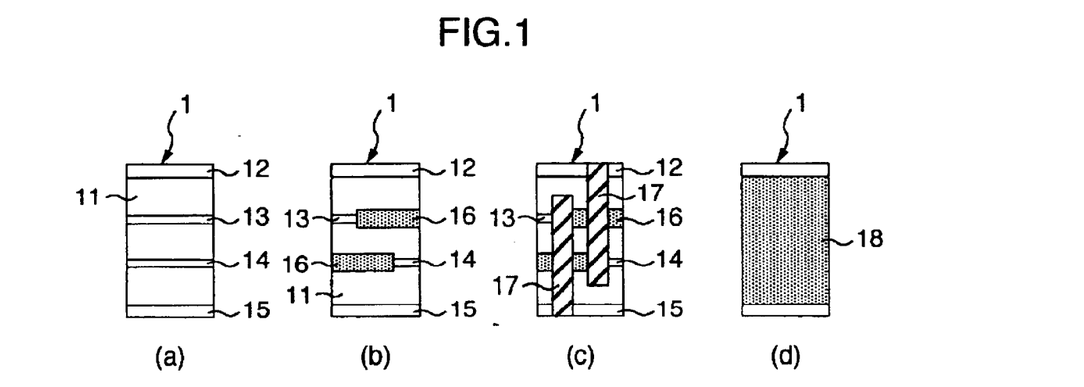
FIG. 1 is a diagram for explaining a multilayer electronic part (piezoelectric ceramic transducer element) according to a first embodiment of the present invention.

FIG. 1 is a diagram showing a multilayer electronic part (piezoelectric ceramics transducer element according to a first embodiment of the invention. In this diagram, 1 designates a multilayer chip-like element, 11 ceramics, 12 a surface electrode, 13 a first internal electrode, 14 a second internal electrode, 15 a back electrode, 16 insulation patterns, 17 conductor patterns and 18 a protective insulating film.

In the chip-like element 1 of multilayer type according to the embodiments of the invention including this embodiment, as shown in (a) of FIG. 1, a ceramics 11 is laid in multiple layers with the internal electrodes 13, 14 therebetween, and the surface electrode 12 and the back electrode 15 are formed on the front and back surface, respectively. Also, the planar shape of all the electrodes is formed equally to the planar shape of the ceramics 11. On the four side surfaces of the chip-like element 1, therefore, the end surfaces of the surface electrode 12, the first internal electrode 13, the second internal electrode 14 and the back electrode 15 is exposed on a single surface.

In the chip-like element 1 having this basic configuration, according to this embodiment, the insulation patterns 16 are formed in such a manner that only a part of the first internal electrode 13 and a part of the second internal electrode 14 are exposed on one side surface of the chip-like element 1, as shown in (b) of FIG. 1. After that, as shown in (c) of FIG. 1, alternate ones of the electrodes 12 to 15 along the thickness of the multilayer are electrically connected to each other by the conductor patterns 17 (in the case under consideration, the surface electrode 12 and the second internal electrode 14 are connected to each other, and the first internal electrode 13 and the back electrode 15 are connected to each other). Then, as shown in (d) of FIG. 1, the side surface of the chip-like element 1 on which the electrodes are connected in a predetermined relation is covered with a protective insulating film 18 thereby to complete a multilayer electronic part. According to this embodiment, the surface electrode 12 and the back electrode 15 function also as electrodes for external connection.

In a multilayer electronic part having this configuration, alternate ones of the electrodes 12 to 15 along the thickness of the multilayer of the chip-like element 1 are connected to each other on one side surface of the chip-like element 1. Therefore, the same planar shape can be obtained for all the electrodes 12 to 15, and as compared with the conventional structure shown in FIGS. 15 and 16, the internal electrode can be formed and the multilayer can be positioned easily (the manufacturing process is simplified), and the size can be minimized.

Figure 2:
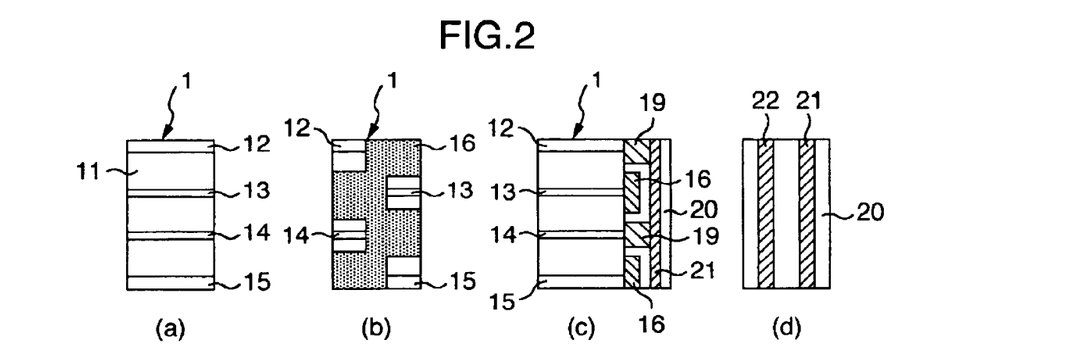
FIG. 2 is a diagram for explaining a multilayer electronic part (piezoelectric ceramic transducer element) according to a second embodiment of the present invention.

FIG. 2 is a diagram showing a multilayer electronic part according to a second embodiment of the invention. In this drawing, the component parts equivalent to those of the aforementioned embodiment are designated by the same reference numerals, respectively, and will not be described except when required (this also applies to the following described embodiments). In FIG. 2, 19 designates an Ag paste, 20 a flexible board, and 21, 22 a pair of electrode patterns formed on the flexible board.

According to this embodiment, as shown in (a) of FIG. 2, a insulation pattern 16 is formed except for the connecting portions of the electrodes 12 to 15 with the flexible board 20, as shown in (b) of FIG. 2, on one side surface of the chip-like element 1 having a similar configuration to the one described above. Then, as shown in (c) of FIG. 2, the electrode patterns 21, 22 of the flexible board 20 are connected electrically to the corresponding exposed portions of the electrodes 12 to 15 by the Ag paste 19. In this way, alternate ones of the electrodes 12 to 15 along the thickness of the multilayer are electrically connected (in the case under consideration, the surface electrode 12 and the second internal electrode 14 are connected to each other by the electrode pattern 21 of the flexible board 20, and the first internal electrode 13 and the back electrode 15 are connected to each other by the electrode pattern 22 of the flexible board 20). Incidentally, (c) of FIG. 2 constitutes a side view as related to (b) of FIG. 2, and (d) of FIG. 2 shows the pattern formed surface of the flexible board 20.

As described above, according to this embodiment, the chip-like element 1 and the flexible board 20 make up a multilayer electronic part, and the surface electrode 12 and the back electrode 15 function as electrodes for external connection. The Ag paste 19 used for connecting the chip-like element 1 and the flexible board 20 may be formed on either the chip-like element 1 or the flexible board 20.

This embodiment configured as described above has a similar effect to the first embodiment. Also, since alternate ones of the electrodes 12 to 15 along the thickness of the multilayer of the chip-like element 1 are connected by the flexible board 20, the production process is simplified.

Figure 3:
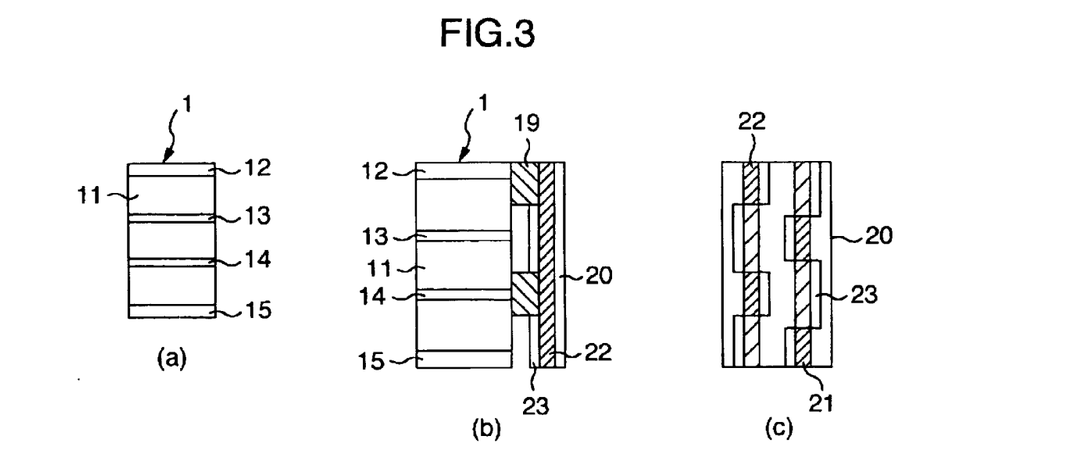
FIG. 3 is a diagram for explaining a multilayer electronic part (piezoelectric ceramic transducer element) according to a third embodiment of the present invention.

FIG. 3 is a diagram showing a multilayer electronic part according to a third embodiment of the invention. In this diagram, 23 designates an insulation pattern formed on the flexible board 20.

This embodiment is different from the second embodiment in that unlike in the second embodiment in which the insulation pattern 16 for making possible selective connection is formed on the chip-like element 1, the insulation pattern 23 making possible selective connection is formed on the pattern formed surface of the flexible board 20. The other points are similar to the corresponding ones of the second embodiment. Incidentally, (b) of FIG. 3 represents a somewhat enlarged side view as related to (a) of FIG. 3 in the case where the surface of the chip-like element 1 shown in (a) of FIG. 3 constitutes a connecting surface, and (c) of FIG. 3 shows a pattern formed surface of the flexible board 20.

Also this embodiment having the aforementioned configuration has an effect similar to that of the second embodiment.

The insulation pattern and the conduction pattern described above can be formed either by a thick film method in which a paste is screen-printed to form a pattern or by a thin film method in which a pattern is formed by depositing by evaporation, sputtering or etching.

Further, the electrical connecting portion of the chip-like element 1 for connection with the electrode pattern of the flexible board 20 may be either an electrode exposed portion of the chip-like element 1 or a conductor pattern portion formed of a thick or thin film on the electrode of the chip-like element 1. The electrical connecting portion of the flexible board 20 for connection with the electrode of the chip-like element 1, on the other hand, may be either an electrode pattern itself of the flexible board 20 or a conductor pattern portion formed of a thick film on the electrode patter of the flexible board 20.

Figure 4:
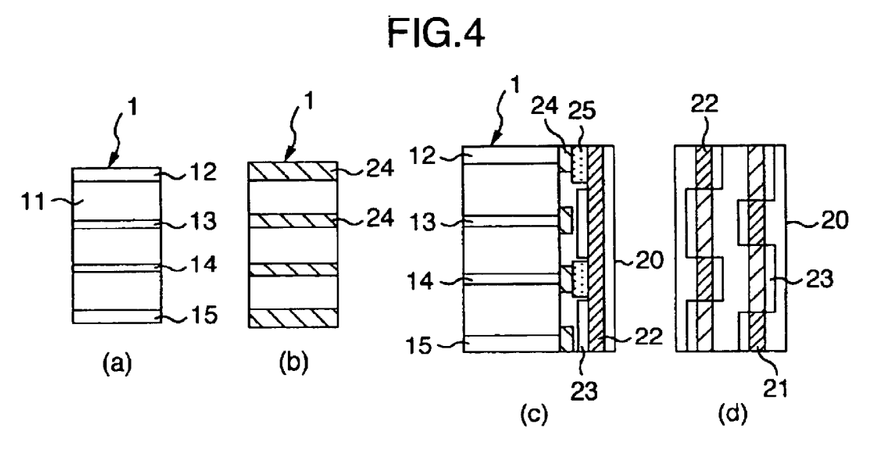
FIG. 4 is a diagram for explaining a multilayer electronic part (piezoelectric ceramic transducer element) according to a fourth embodiment of the present invention.

FIG. 4 is a diagram showing a multilayer electronic part according to a fourth embodiment of the invention. In this diagram, 24 designates plated film portions formed on the electrode exposed portion of the chip-like element 1, and 25 a connecting solder.

This embodiment is different from the third embodiment in that, as shown in (a) of FIG. 4, the plated film portion 24 is formed on each of the electrodes 12 to 15 as shown in (b) of FIG. 4 on one side surface of the chip-like element 1 having a similar configuration and in that the solder 25 formed on the chip-like element 1 or the flexible board 20 is used as shown in (c) of FIG. 4 for electrically connecting the chip-like element 1 and the flexible board 20. The other points are similar to the corresponding points of the third embodiment. Incidentally, (c) of FIG. 4 is a somewhat enlarged side view as related to (b) of FIG. 4, and (d) of FIG. 4 shows a pattern formed surface of the flexible board 20.

This embodiment having the aforementioned configuration has a similar effect to the second embodiment.

Figure 5:
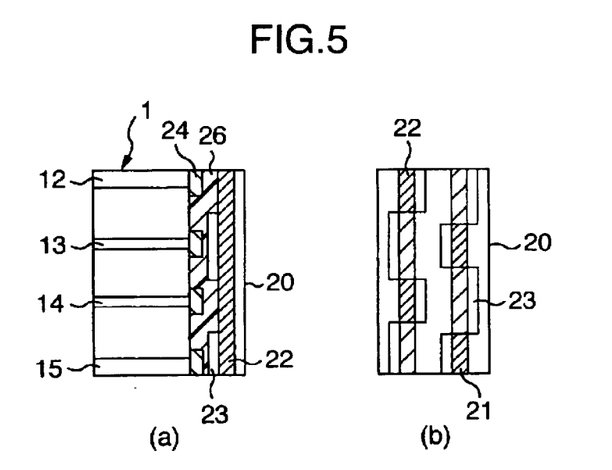
FIG. 5 is a diagram for explaining a multilayer electronic part (piezoelectric ceramic transducer element) according to a fifth embodiment of the present invention.

FIG. 5 is a diagram showing a multilayer electronic part according to a fifth embodiment of the invention. In this diagram, 26 designates an anisotropic conductive film.

This embodiment is different from the fourth embodiment in that as shown in (a) of FIG. 5, the anisotropic conductive film 26 is used for connecting the chip-like element 1 and the flexible board 20 electrically to each other, and the remaining points are similar to the fourth embodiment. Incidentally, (b) of FIG. 5 shows a pattern formed surface of the flexible board 20.

This embodiment having the above-mentioned configuration has a similar effect to the second embodiment.

Incidentally, the chip-like element 1 and the flexible board 20 can be electrically connected to each other not only by the aforementioned means but also by such a method as wire bonding or metal diffusion connection method.

Figure 6:
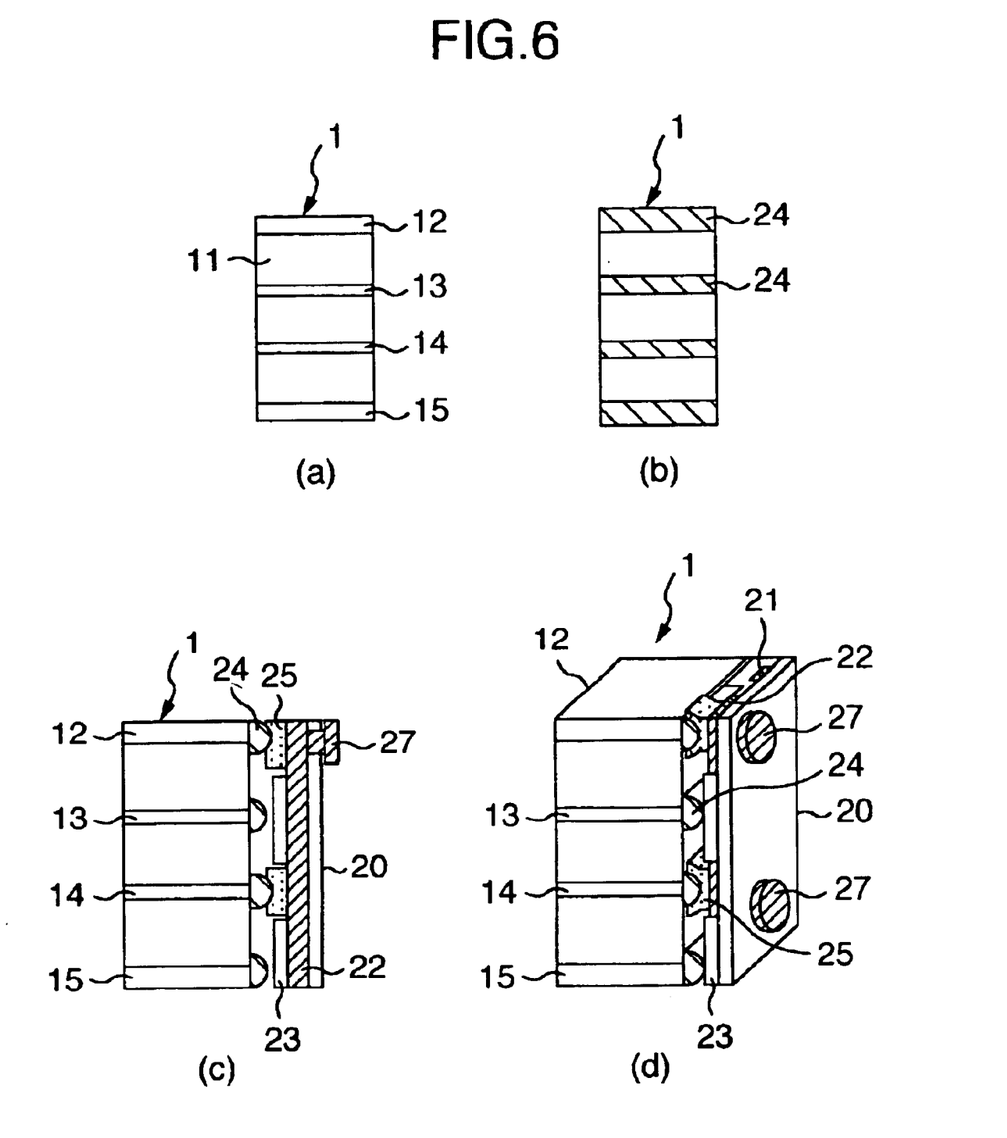
FIG. 6 is a diagram for explaining a multilayer electronic part (piezoelectric ceramic transducer element) according to a sixth embodiment of the present invention.

FIG. 6 is a diagram showing a multilayer electronic part according to a sixth embodiment of the invention. In the diagram, 27 designates electrode pads formed through the flexible board 20.

This embodiment is different from the fourth embodiment in that as shown in (c) and (d) of FIG. 6, the electrode pads 27, 27 exposed on the side of the flexible board 20 far from the pattern formed surface thereof and connected to the electrode patterns 21, 22, respectively, of the flexible board 20, constitute electrodes for external connection. The other points are similar to the corresponding points of the fourth embodiment.

The present embodiment having this configuration has a similar effect to the second embodiment. Further, the present embodiment has the effect of facilitating the external connection of the multilayer electronic part in view of the fact that the electrode pair for external connection can be concentrated on one side surface of the multilayer electronic part.

Figure 7:
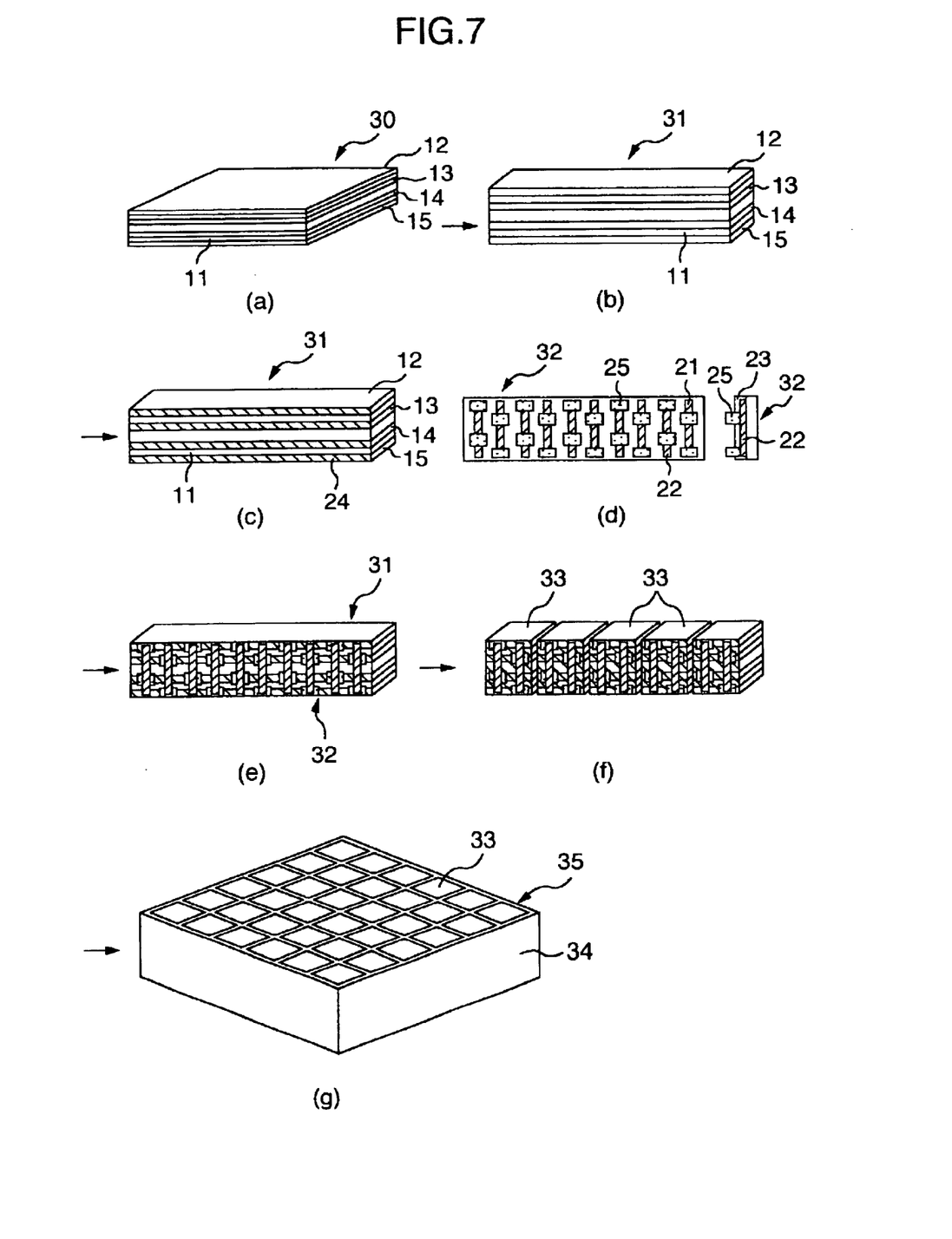
FIG. 7 is a diagram for explaining an example of a method for manufacturing a multilayer electronic part and a method for manufacturing a two-dimensionally arrayed element packaging structure using the former manufacturing method according to an embodiment of the present invention.

Now, a method of manufacturing the multilayer electronic part described above and an example of a method of manufacturing a two-dimensionally arrayed element packaging structure using the former method will be explained with reference to FIG. 7. FIG. 7 shows a method of manufacturing a multilayer electronic part corresponding to the fourth embodiment of FIG. 4 and a method of manufacturing a two-dimensionally arrayed element packaging structure using the multilayer electronic part.

First, as shown in (b) of FIG. 7, a bar-shaped subbase member 31 as wide as one chip is cut out from a tabular chip-like base member 30 as shown in (a) of FIG. 7. Then, as shown in (c) of FIG. 7, a plated film portion 24 is formed on the end surface of each of the electrodes 12 to 15 exposed to a predetermined long side surface of the base member 31 thus cut out.

As shown in (d) of FIG. 7, on the other hand, the flexible board base member 32 having a multiplicity of electrode pattern pairs 21, 22 is formed with an insulation pattern making selective connection possible, after which a connecting solder 25 is formed at each portion of the electrode patterns 21, 22 exposed from the insulation pattern 23.

Then, as shown in (e) of FIG. 7, the connecting surfaces of the bar-shaped subbase member 31 and the flexible board base member 32 are attached close to each other in position and heat treated thereby to electrically connect the connecting points of the subbase member 31 and the flexible board base member 32 to each other. After that, a minuscule gap (10 to several tens of μm) between the subbase member 31 and the flexible board base member 32 is filled with an insulating adhesive (such as a urethane resin adhesive of low viscosity), so that the subbase member 31 and the flexible board base member 32 are mechanically firmly connected to each other.

Then, as shown in (f) of FIG. 7, each multilayer electronic part 33 is cut out by dicer from the integrated base member including the subbase member 31 and the flexible board base member 32 thereby to complete the multilayer electronic parts 33.

Each multilayer electronic part 33 completed through the processes described above is inspected, and as shown in (g) of FIG. 7, a predetermined number of acceptable multilayer electronic parts 33 are combined in columns and rows and integrated by the resin 34. In this way, a module 35 is produced for a two-dimensionally arrayed probe. A multiplicity of the modules 35 are combined to complete a two-dimensionally arrayed probe.

The two-dimensionally arrayed probe produced by combining the modules 35 as described above can reduce the size of each multilayer electronic part and thus can reduce the whole size. Nevertheless, the external connection of each multilayer electronic part requires considerable tact. The external connection is easy and accurate advantageously for a multilayer electronic part (or an electronic part of single layer type) having such configuration that a pair of electrodes for external connection are arranged on the extension of the flexible board attached to the side surface of the chip-like element as described below.

Figure 8:
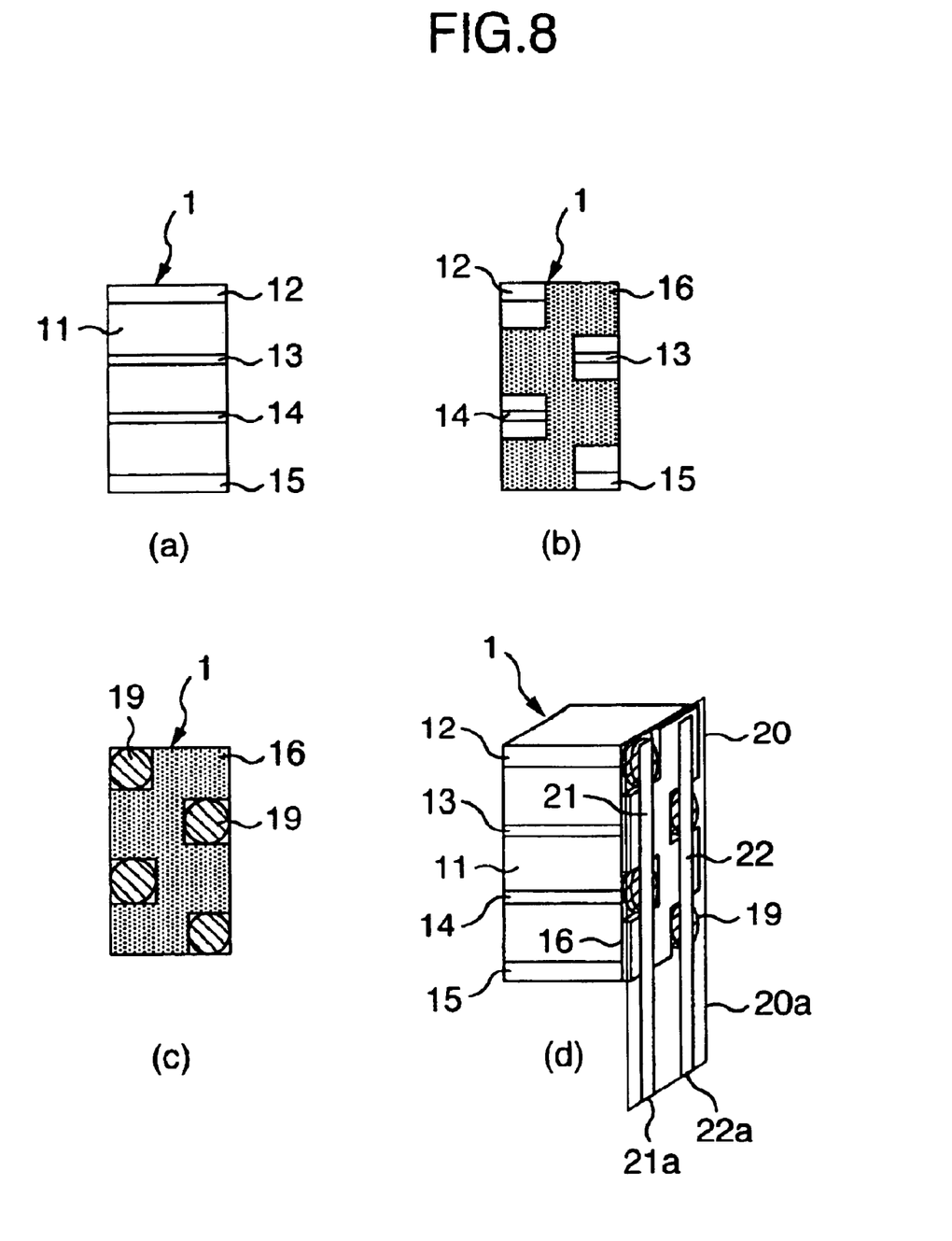
FIG. 8 is a diagram for explaining a multilayer electronic part (piezoelectric ceramic transducer element) according to a seventh embodiment of the present invention.

FIG. 8 is a diagram showing a multilayer electronic part according to a seventh embodiment of the invention. This embodiment is an example of a development from the second embodiment shown in FIG. 2.

This embodiment is different from the second embodiment in that an extension 20a is formed on the flexible board 20 connected to one side surface of the chip-like element 1, and the end portions of the electrode patterns 21, 22 of the flexible board 20 for electrically connecting alternate ones of the electrodes 12 to 15 along the thickness of the multilayer of the chip-like element 1 are constituted of the electrode portions 21a, 22a for external connection. The remaining points are similar to those of the second embodiment.

In the multilayer electronic part according to this embodiment having the above-mentioned configuration, alternate ones of the electrodes 12 to 15 along the thickness of the multilayer of the chip-like element 1 are connected to each other on one side surface of the chip-like element 1, and therefore all the electrodes 12 to 15 have the same planar shape. As compared with the conventional structure shown in FIGS. 15 and 16, therefore, the formation of the internal electrode can be formed and the multilayer positioning are facilitated (the production process is simplified), while at the same time minimizing the size. In addition, alternate ones of the electrodes 12 to 15 along the thickness of the multilayer of the chip-like element 1 are connected by the flexible board 20, which is another contributing factor to a simplified production process. Further, in view of the fact that the extension 20a is formed on the flexible board 20, and the end portions of the electrode patterns 21, 22 on the extension 20a constituting the electrode portions 21a, 22a for external connection are led out in the same direction, the external connection of the multilayer electronic parts is facilitated and assured. Even in the case where a multiplicity of multilayer electronic parts are combined into a module, therefore, the superior connection performance is exhibited to the full. Furthermore, the ill connection of the multilayer electronic parts can be individually handled easily, thereby making possible replacement and repair easier and more accurate.

Figure 9:
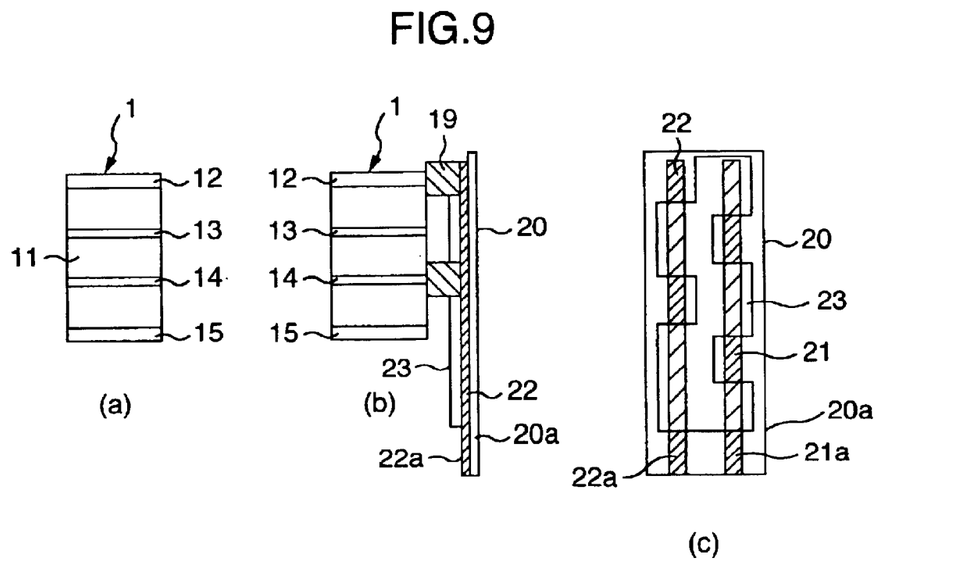
FIG. 9 is a diagram for explaining a multilayer electronic part (piezoelectric ceramic transducer element) according to an eighth embodiment of the present invention.

FIG. 9 is a diagram showing a multilayer electronic part according to an eighth embodiment of the invention. This embodiment is an example of a development from the this embodiment shown in FIG. 3. This embodiment is different from the third embodiment in that an extension 20a is formed on the flexible board 20 and the portions of the electrode patterns 21, 22 on the extension 20a constitute the electrode portions 21a, 22a for external connection. The remaining points are similar to the corresponding points of the third embodiment.

This embodiment having the aforementioned configuration has the same effect as the seventh embodiment.

Figure 10:
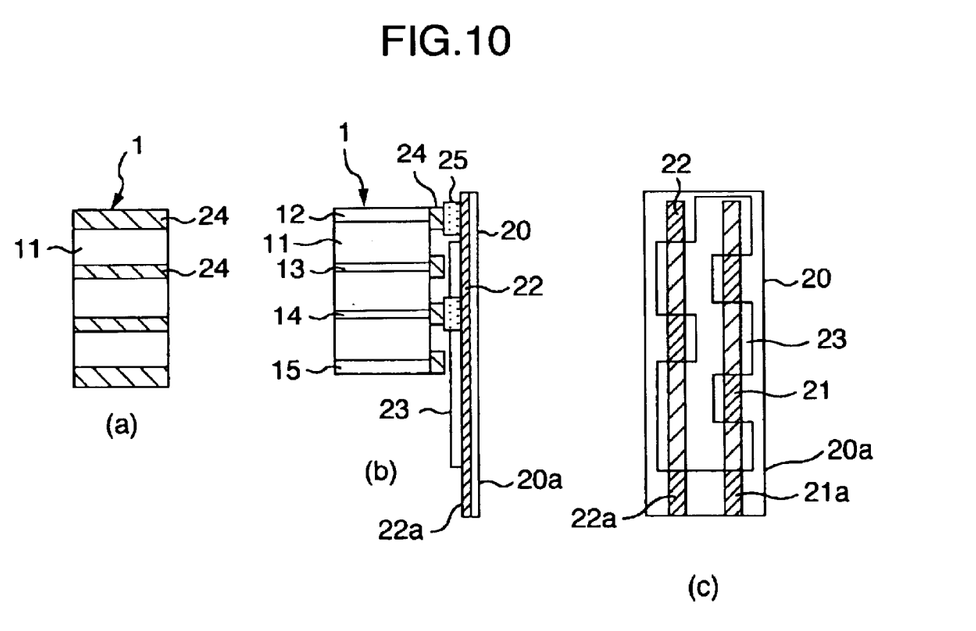
FIG. 10 is a diagram for explaining a multilayer electronic part (piezoelectric ceramic transducer element) according to a ninth embodiment of the present invention.

FIG. 10 is a diagram showing a multilayer electronic part according to a ninth embodiment of the invention. This embodiment is an example of a development from the fourth embodiment described above. This embodiment is different from the fourth embodiment in that an extension 20a is formed on the flexible board 20, and the portions of the electrode patterns 21, 22 of the flexible board 20 on the extension 20a constitute the electrode portions 21a, 22a for external connection. The remaining points are similar to the corresponding points of the fourth embodiment.

The present embodiment having this configuration has a similar effect to the seventh embodiment.

Figure 11:
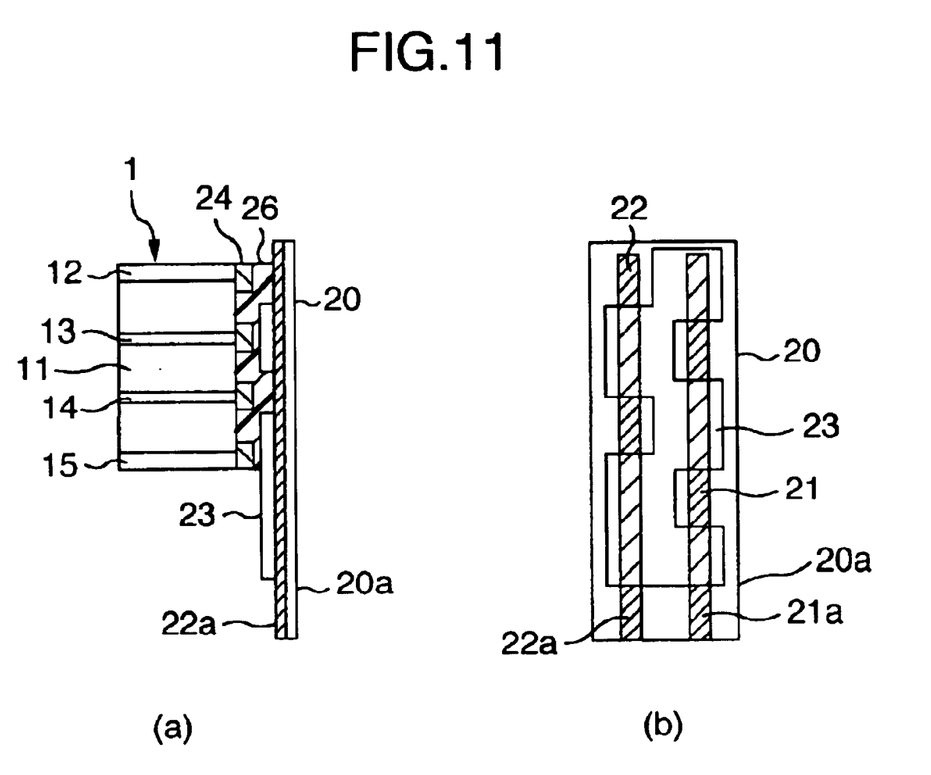
FIG. 11 is a diagram for explaining a multilayer electronic part (piezoelectric ceramic transducer element) according to a tenth embodiment of the present invention.

FIG. 11 is a diagram showing a multilayer electronic part according to a tenth embodiment of the invention. This embodiment is an example of a development from the fifth embodiment described above. This embodiment is different from the fifth embodiment in that an extension 20a is formed on the flexible board 20, and the portions of the electrode patterns 21, 22 on the extension 20a constitute the electrode portions 21a, 22a for external connection. The remaining points are similar to the corresponding points of the fourth embodiment.

The present embodiment having this configuration has a similar effect to the seventh embodiment.

The first to tenth embodiments described above represent an example of the multilayer electronic part with a multiplicity of ceramic layers laid one on another. Now, an explanation will be given of an application to a piezoelectric ceramic transducer element of a single plate type having a single layer of ceramics.

Figure 12:
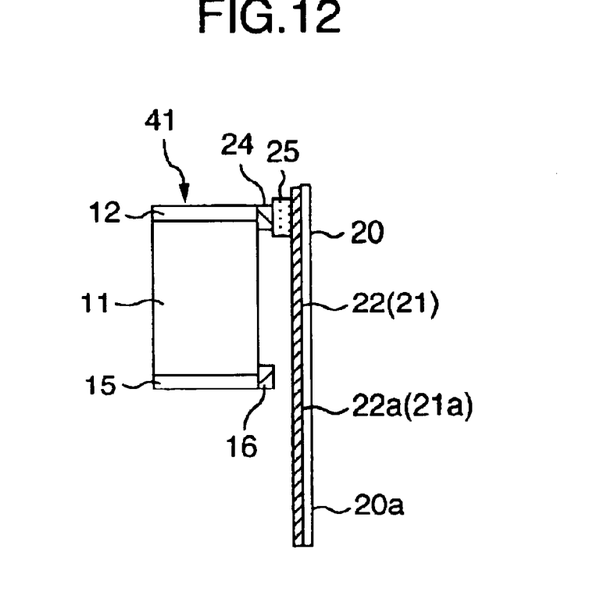
FIG. 12 is a diagram for explaining an electronic part (piezoelectric ceramic transducer element) of single layer type according to an 11th embodiment of the present invention.

FIG. 12 is a diagram showing an electronic part (piezoelectric ceramics transducer element) according to an 11th embodiment of the invention. In this diagram, 41 designates a chip-like element of single layer (single plate) type. The single-plate ceramics 11 is formed with a surface electrode 12 and a back electrode 15. An insulation pattern 16 and a plated film portion 24 are formed selectively on the surface electrode 12 and the back electrode 15 on one side surface of the chip-like element 41. The plated film portion 24 is electrically connected to the corresponding electrode patterns 21, 22 of the flexible board 20 by a solder 25. An extension 20a is formed on the flexible board 20, and the portions of the electrode patterns 21, 22 on the extension 20a function as the electrode portions 21a, 22a for external connection.

The present embodiment having this configuration represents a piezoelectric ceramic transducer element of single layer (single plate) type, and therefore is inferior in performance to that of the piezoelectric ceramic transducer element of multilayer type. Nevertheless, the multilayer electronic part can be easily and positively connected externally in view of the fact that the flexible board 20 has an extension 20a and the end portions of the electrode patterns 21, 22 of the flexible board 20 on the extension 20a constitute the electrode portions 21a, 22a for external connection and are led out in the same direction. In the case where a multiplicity of multilayer electronic parts are combined into a module, therefore, the superior connection performance is exhibited to the full. Further, ill connection of the multilayer electronic part can be handled individually with ease, thereby facilitating positive replacement or repair.

Figure 13:
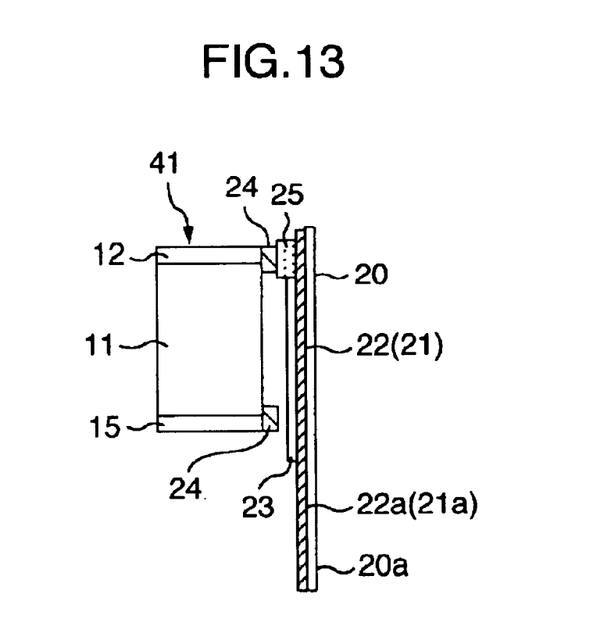
FIG. 13 is a diagram for explaining an electronic part (piezoelectric ceramic transducer element) of a single layer type according to a 12th embodiment of the present invention.

FIG. 13 is a diagram showing an electronic part (piezoelectric ceramic transducer element) according to a 12th embodiment of the invention. This embodiment is different from the 11th embodiment in that unlike in the 11th embodiment having an insulation pattern 16 on the chip-like element 41 of single layer (single plate) type, the 12th embodiment is formed with an insulation pattern 23 on the flexible board 20. The remaining points are similar to the corresponding ones of the 11th embodiment.

Also the present embodiment having this configuration exhibits a similar effect to the 11th embodiment.

The multilayer electronic part (piezoelectric ceramics transducer element) shown in the first to tenth embodiments has three layers of ceramics. However, the number of layers of ceramics in the multilayer electronic part according to this invention is not limited and arbitrary.

In the case where a multilayer electronic part or an electronic part is constituted of a chip-like element and a flexible board as shown in the second to 12th embodiments described above, the solder, the thermoplastic paste or the anisotropic conductive sheet or the like arbitrary means can be employed for electrical connection between the chip-like element and the flexible board as described above. Nevertheless, for securing the mechanical strength, it is preferable to fill an insulating adhesive (such as an urethan resin adhesive of low viscosity) in the minuscule gap between the chip-like element and the flexible board.

Now, an example of a method of manufacturing a multilayer electronic part so configured that the electrode portions 21a, 22a for external connection are arranged on the extension 20a of the flexible board 20 described above and an example of a method for manufacturing a two-dimensionally arrayed element packaging structure using the multilayer electronic part will be explained below with reference to FIG. 14.

Figure 14:
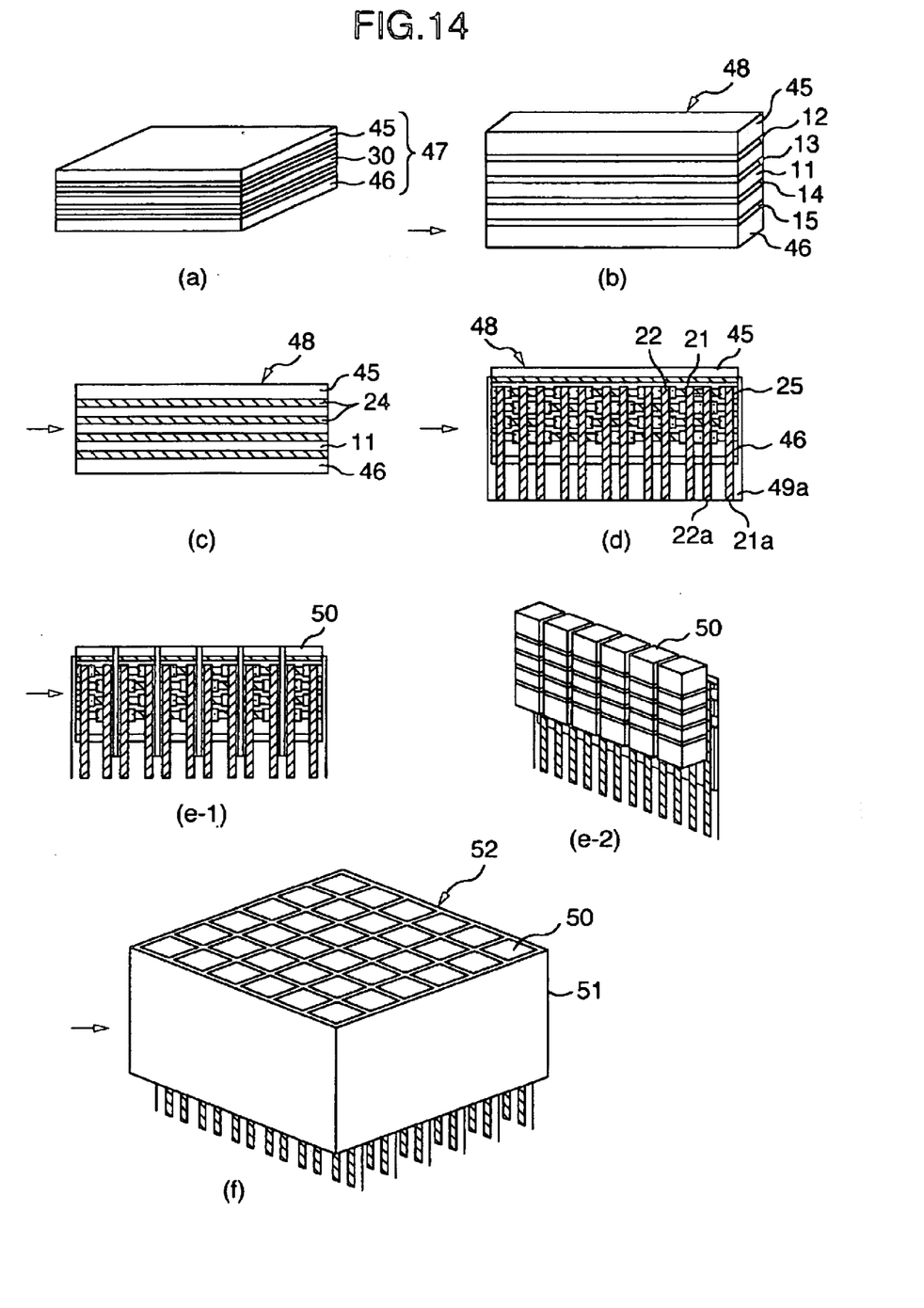
FIG. 14 is a diagram for explaining another example of a method for manufacturing a multilayer electronic part and a method for manufacturing a two-dimensionally arrayed element packaging structure using the former manufacturing method according to an embodiment of the present invention.

First, as shown in (a) of FIG. 14, a tabular sound matching layer 45 and a tabular sound attenuation layer 46 are fixedly integrated above and under a tabular chip-like element base member 30 to prepare a chip-like element composite base member 47. Then, as shown in (b) of FIG. 14, a bar-shaped subcomposite base member 48 as wide as one chip is cut out from the chip-like element composite base material 47.

Then, as shown in (c) of FIG. 14, Ni is plated on the end surfaces of the electrodes 12 to 15 exposed to a predetermined longitudinal side surface of the bar-shaped subcomposite base member 48 thus cut out, and Au is plated on the surface of the Ni plating thereby to form plated film portions 24.

On the other hand, as shown in (d) of FIG. 14, the flexible board base member 49 including a multiplicity of electrode pattern pairs 21, 22 is formed with an insulation pattern for making possible selective connection, after which the portions of the electrode patterns 21, 22 exposed from the insulation pattern are formed with a connecting solder 25. At the same time, the extension 49a of the flexible board base member 49 are formed with electrode portions 21a, 22a for external connection which are connected with the mating electrode patterns 21, 22, respectively. The connecting surfaces of the bar-shaped subcomposite base member 48 and the flexible board base member 49 are closely attached to each other in position and heat treated. In this way, the connectors of the subcomposite base member 48 and the flexible board base member 49 are electrically connected to each other. After that, the minuscule gap (10 to several tens of $\mu$m) between the subcomposite base member 48 and the flexible board base member 49 is filled with an insulative adhesive (such as an urethane resin adhesive of low viscosity) thereby to firmly connect the subcomposite base member 48 and the flexible board base member 49 mechanically to each other.

Then, as shown in (e-1) and (e-2) of FIG. 7, each multilayer electronic part 50 is cut out by dicer from the integrated base member of the subcomposite base member 48 and the flexible board base member 49, thereby completing a multilayer electronic part (ceramic transducer element) 50 with the sound matching layer 45 and the sound attenuation layer 46.

The multilayer electronic parts 50 completed through the processes described above are inspected, and as shown in (f) of FIG. 14, a predetermined number of acceptable ones of the multilayer electronic parts 50 are combined in columns and rows and integrated by resin 51 thereby to fabricate a module 52 for a two-dimensionally arrayed probe. Then, each multilayer electronic part 50 of the module 52 is inspected. With a structure in which the electrodes are connected by one side surface of each multilayer electronic part 50 and by the use of the solder, the thermoplastic paste or the anisotropic conductive sheet for the connectors, as described above, each defective element can be replaced or the ill connection of each element can be repaired easily like in the normal semiconductor device such as LSI.

Finally, a two-dimensionally arrayed probe is completed by combining a multiplicity of acceptable ones of the modules 52. In this example, a two-dimensionally arrayed probe is produced by arranging 64 modules 52 as elements each including 64×64 multilayer electronic parts 50 arranged in 15 mm×15 mm.

The example shown in FIG. 14 refers to the multilayer piezoelectric ceramic element (multilayer electronic part), and a two-dimensionally arrayed probe can of course be produced by a similar method with a single-layer piezoelectric ceramic element (single-layer electronic part) shown in FIGS. 12 and 13.

Also, the bonding of the sound matching layer and the sound attenuation layer is not specifically limited to the production process of FIG. 14, but the sound matching layer and the sound attenuation layer may be fixedly attached to the multilayer piezoelectric ceramic elements (multilayer electronic parts) after being aligned in matrix.

As described above, according to this invention, a multilayer element can be used as a piezoelectric ceramic transducer element, and a two-dimensionally arrayed probe (element packaging structure) can be realized in which each element can be replaced or the ill connection of each element can be repaired. Also, a piezoelectric ceramic transducer element (multilayer electronic part) can be provided which is suitable for realizing such an element packaging structure.

INDUSTRIAL APPLICABILITY

As described above, according to this invention, a multilayer electronic part is configured of a multilayer chip-like element having a surface electrode, an internal electrode and a back electrode on the one hand and a flexible board attached to one side surface of the chip-like element on the other hand, wherein alternate ones of the electrodes along the thickness of the multilayer of the chip-like element are electrically connected to each other by an electrode pattern of the flexible board thereby to form two electrode groups, and the end portions of the electrode pattern of the flexible board are used as two electrode portions for external connection which are electrically connected to the two electrode groups. Thus, a two-dimensionally arrayed probe (element packaging structure) is provided in which a multilayer element can be used as a piezoelectric ceramic transducer element and each defective element can replaced or the ill connection of each element can be repaired. Also, a multilayer electronic part is provided which is suitable for realizing such an element packaging structure.

What is claimed is:

1. A multilayer electronic part having a surface electrode, an internal electrode and a back electrode, wherein alternate ones of the electrodes along the thickness of the multilayer are electrically connected to each other thereby to constitute two electrode groups, the multilayer electronic part having two electrode portions for external connection which are electrically connected with said two electrode groups, characterized in that said two electrode groups are electrically connected on one side surface of said multilayer electronic part, said one side surface being partially formed of respective one side edges of said surface electrode, said internal electrode and said back electrode.

2. A multilayer electronic part as described in claim 1, characterized in that said multilayer electronic part is configured with a chip-like element and a flexible board attached to one side surface of said chip-like element forming a portion of said one side surface of said multilayer electronic part, and alternate ones of the electrodes along the thickness of the multilayer of said chip-like element are connected to each other by an electrode pattern of said flexible board thereby to constitute said two electrode groups.

3. A multilayer electronic part as described in claim 2, characterized in that an insulative adhesive is filled in the minuscule gap between said chip-like element and said flexible board.

4. A multilayer electronic part as described in claim 2, characterized in that said two electrode portions for external connection are formed on one side surface of said chip-like element or the extension of said one side surface.

5. A multilayer electronic part as described in claim 4, characterized in that said two electrode portions for external connection are formed of the end portions of a pair of said electrode patterns of said flexible board.

6. A multilayer electronic part as described in claim 2, characterized in that each of said electrodes of said chip-like element and said electrode pattern of said flexible board are connected to each other by a thick film conductive paste or a solder or an anisotropic conductive sheet.

7. A multilayer electronic part as described in claim 2, characterized in that an insulation pattern for cutting off the conduction between adjacent electrodes along the thickness of the multilayer of said chip-like element is formed on said chip-like element or said flexible board.

8. A method of manufacturing a multilayer electronic part configured with a chip-like element having a surface electrode, an internal electrode and a back electrode and a flexible board attached to one side surface of said chip-like element, wherein one side edge of alternate ones of the electrodes along the thickness of a multilayer of said chip-like element forming a portion of said one side surface of said chip-like element are electrically connected to each other by an electrode pattern of said flexible board thereby to constitute two electrode groups, and two electrode portions for external connection which are electrically connected with said two electrode groups are formed of the electrode pattern of said flexible board or a conductive portion connected to said electrode pattern;

said method comprising the steps of cutting out a bar-shaped subbase member as wide as one chip from the base member of said chip-like element, electrically connecting alternate ones of the one side edge of the electrodes along the thickness of said bar-shaped subbase member with each electrode pattern of said flexible board base member including a multiplicity of electrode pattern pairs by fixedly connecting said flexible board base member to the longitudinal side surface of said bar-shaped base member, and cutting out each multilayer electronic part from an integrated member of said bar-shaped subbase member and said flexible board base member.

9. A method of manufacturing a multilayer electronic part as described in claim 8, characterized in that said manufacturing steps are carried out with other members attached to the upper and lower surfaces of the base member of said chip-like element.

10. A method of manufacturing a multilayer electronic part as described in claim 8, characterized in that an insulative adhesive is filled in the minuscule gap between said bar-shaped subbase member and the base member of said flexible board with said bar-shaped base member and said base member of said flexible board integrated with each other.

11. A method of manufacturing a multilayer electronic part as described in claim 8, characterized in that each of said electrodes exposed to the long side surface of said bar-shaped subbase member is plated for connection assistance.

12. A method of manufacturing a multilayer electronic part as described in claim 8, characterized in that an insulative pattern for cutting off the conduction between the adjacent electrodes along the thickness of the multilayer of said bar-shaped subbase member is formed on said flexible board.

13. A two-dimensionally arrayed element packaging structure characterized in that a plurality of electronic parts are integrated by being arranged in columns and rows in a two-dimensional array as a module, wherein each of said electronic parts is configured with a chip-like element having at least a surface electrode and a back electrode and a flexible board attached to one side surface of said chip-like element, one side edge of the surface electrode and one side edge of the back electrode of said chip-like element forming a portion of said one side surface of said chip-like element are electrically connected to a corresponding electrode pattern of said flexible board, and two electrode portions for external connection which are electrically connected to said surface electrode and said back electrode are formed of the electrode pattern of said flexible board or a conductive portion connected with said electrode pattern.

14. A two-dimensionally arrayed element packaging structure as described in claim 13, characterized in that each of said electrodes of said chip-like element and said electrode pattern of said flexible board are connected to each other by a thick-film conductive paste or a solder or an anisotropic conductive sheet.

15. A two-dimensionally arrayed element packaging structure as described in claim 13, characterized in that said chip-like element is a single-layer structured element having only a surface electrode and a back electrode or a multilayer structured element having a surface electrode, an internal electrode and a back electrode.

16. A method of manufacturing a two-dimensionally arrayed element packaging structure, characterized in that only a plurality of acceptable ones of the multilayer electronic parts as described in any one of claims 1 to 7 or only a plurality of acceptable ones of the multilayer electronic parts manufactured by the manufacturing method as described in any one of claims 8 to 12 are integrated by being aligned in columns and rows thereby to complete a two-dimensionally arrayed module.

17. A multilayer electronic part as described in claim 1, wherein each of the electrodes has the same planar shape and area, and the electrical connection of said electrodes of said multilayer electronic part is effected only on said one side surface.

18. A multilayer electronic part as described in claim 17, wherein said electrodes form a portion of a stacked transducer, and the electrical connection of said electrodes is effected only at said one surface which is an outer surface of the stacked transducer.

19. A method of manufacturing a multilayer electronic part as described in claim 8, wherein each of said electrodes has the same planar shape and area, and the electrical connection of said electrodes of said multilayer electronic part is effected only on said one side surface.

20. A method of manufacturing a multilayer electronic part as described in claim 19, wherein said electrodes form a portion of a stacked transducer, and the electrical connection of said electrodes is effected only at said one surface which is an outer surface of the stacked transducer.

21. A two-dimensionally arrayed element packaging structure as described in claim 13, wherein each of said electrodes has the same planar shape and area, and the electrical connection of said electrodes of said multilayer electronic part is effected only on said one side surface.

22. A two-dimensionally arrayed element packaging structure as described in claim 13, wherein said electrodes form a portion of a stacked transducer, and the electrical connection of said electrodes is effected only at said one surface which is an outer surface of the stacked transducer.

* * * * *